US012418605B2

(12) United States Patent
Hwang et al.

(10) Patent No.: US 12,418,605 B2
(45) Date of Patent: Sep. 16, 2025

(54) ELECTRONIC DEVICE INCLUDING ANTENNA MODULE

(71) Applicant: Samsung Electronics Co., Ltd., Suwon-si (KR)

(72) Inventors: Hangyu Hwang, Suwon-si (KR); Changsu Kim, Suwon-si (KR); Pranveer Singh Rathore, Suwon-si (KR); Yongseok Lee, Suwon-si (KR); Sangsik Na, Suwon-si (KR); Hyunjung Jung, Suwon-si (KR); Jinho Lim, Suwon-si (KR); Minwoo Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 399 days.

(21) Appl. No.: 17/831,963

(22) Filed: Jun. 3, 2022

(65) Prior Publication Data

US 2022/0400171 A1 Dec. 15, 2022

Related U.S. Application Data

(63) Continuation of application No. PCT/KR2022/007212, filed on May 20, 2022.

(30) Foreign Application Priority Data

Jun. 14, 2021 (KR) .................. 10-2021-0076961

(51) Int. Cl.
*H04M 1/18* (2006.01)
*H01Q 1/24* (2006.01)
(52) U.S. Cl.
CPC .............. *H04M 1/18* (2013.01); *H01Q 1/243* (2013.01)

(58) Field of Classification Search
CPC ..... H01Q 13/28; H04M 1/0249; H04M 1/185
See application file for complete search history.

(56) References Cited

U.S. PATENT DOCUMENTS

| 5,955,752 A | * | 9/1999 | Fukaya | ................... H01Q 1/42 257/664 |
| 8,947,303 B2 | * | 2/2015 | Golko | ................. H01Q 9/0407 343/702 |

(Continued)

FOREIGN PATENT DOCUMENTS

| JP | 2016-036104 A | 3/2016 |
| KR | 10-2015-0043105 A | 4/2015 |

(Continued)

OTHER PUBLICATIONS

International Search Report dated Aug. 26, 2022, issued in International Application No. PCT/KR2022/007212.

(Continued)

*Primary Examiner* — Imani N Hayman
*Assistant Examiner* — Theron S Milliser
(74) *Attorney, Agent, or Firm* — Jefferson IP Law, LLP

(57) ABSTRACT

A portable electronic device is provided. The portable electronic device includes a metal housing, an antenna module positioned in the metal housing, a first injection-molded member positioned in a radiation direction of the antenna module and having a first dielectric constant, a second injection-molded member at least partially in contact with the first injection-molded member, positioned in the radiation direction of the antenna module, and having a second dielectric constant different from the first dielectric constant, and a first organic film disposed along an inner surface of the metal housing to bond with at least a portion of the first injection-molded member, wherein the second injection-molded member forms, together with the metal housing, an exterior of the portable electronic device, and wherein the (Continued)

second injection-molded member is coupled with the first injection-molded member through a coupling structure in which one of the first injection-molded member or the second injection-molded member is at least partially protruding into another one of the first injection-molded member or the second injection-molded member.

20 Claims, 12 Drawing Sheets

(56) References Cited

U.S. PATENT DOCUMENTS

| | | | | |
|---|---|---|---|---|
| 9,007,748 | B2* | 4/2015 | Jarvis | G06F 1/1656 |
| | | | | 361/679.01 |
| 9,634,378 | B2* | 4/2017 | Golko | H01Q 21/00 |
| 9,755,296 | B2* | 9/2017 | Jarvis | H01Q 1/243 |
| 10,050,681 | B2* | 8/2018 | Kim | H04B 7/088 |
| 10,290,926 | B2* | 5/2019 | Jarvis | H04M 1/0249 |
| 10,321,590 | B2 | 6/2019 | Cater et al. | |
| 10,372,166 | B2* | 8/2019 | Gable | H05K 5/15 |
| 10,439,271 | B2* | 10/2019 | Jarvis | H01Q 1/2258 |
| 10,819,018 | B2* | 10/2020 | Seo | H05K 1/141 |
| 10,819,029 | B2* | 10/2020 | Amiri | H01Q 9/16 |
| 10,873,125 | B2* | 12/2020 | Jarvis | G06F 1/1656 |
| 10,886,619 | B2* | 1/2021 | Avser | H01Q 1/243 |
| 11,050,136 | B2* | 6/2021 | Jung | H04M 1/02 |
| 11,056,767 | B2* | 7/2021 | Park | H01Q 1/243 |
| 11,228,105 | B2* | 1/2022 | Yun | H01Q 21/28 |
| 11,264,734 | B2* | 3/2022 | Lee | H01Q 21/28 |
| 11,387,573 | B2* | 7/2022 | Lee | H01Q 1/2283 |
| 11,728,569 | B2* | 8/2023 | Avser | H01Q 21/0075 |
| | | | | 343/702 |
| 11,862,876 | B2* | 1/2024 | Kim | H01Q 1/243 |
| 12,009,576 | B2* | 6/2024 | Varma | H01Q 1/243 |
| 12,224,484 | B2* | 2/2025 | Jarvis | H04M 1/026 |
| 2012/0157175 | A1* | 6/2012 | Golko | H01Q 1/243 |
| | | | | 343/702 |
| 2013/0050911 | A1 | 2/2013 | Jarvis | |
| 2015/0188215 | A1* | 7/2015 | Jarvis | H04M 1/026 |
| | | | | 343/702 |
| 2015/0214600 | A1* | 7/2015 | Golko | H01Q 21/28 |
| | | | | 343/702 |
| 2015/0263417 | A1* | 9/2015 | Kim | H01Q 19/13 |
| | | | | 343/872 |
| 2016/0365900 | A1 | 12/2016 | Kim et al. | |
| 2017/0346166 | A1* | 11/2017 | Jarvis | G06F 1/1626 |
| 2018/0017995 | A1 | 1/2018 | Gable et al. | |
| 2018/0070465 | A1 | 3/2018 | Cater et al. | |
| 2018/0301792 | A1 | 10/2018 | Park et al. | |
| 2019/0020102 | A1* | 1/2019 | Jarvis | H01Q 1/521 |
| 2019/0165473 | A1 | 5/2019 | Yun et al. | |
| 2019/0393588 | A1* | 12/2019 | Jarvis | H04M 1/026 |
| 2020/0028241 | A1 | 1/2020 | Jung et al. | |
| 2020/0144698 | A1 | 5/2020 | Seo et al. | |
| 2020/0203804 | A1 | 6/2020 | Khripkov et al. | |
| 2020/0259258 | A1 | 8/2020 | Amiri et al. | |
| 2020/0280133 | A1* | 9/2020 | Avser | H01Q 5/42 |
| 2021/0075115 | A1 | 3/2021 | Kim et al. | |
| 2021/0091457 | A1* | 3/2021 | Jarvis | H01Q 1/521 |
| 2021/0119338 | A1 | 4/2021 | Avser et al. | |
| 2021/0167487 | A1* | 6/2021 | Varma | H01Q 1/38 |
| 2021/0210869 | A1 | 7/2021 | Lee et al. | |
| 2021/0218128 | A1* | 7/2021 | Lee | H01Q 21/062 |

FOREIGN PATENT DOCUMENTS

| | | |
|---|---|---|
| KR | 10-2016-0042163 A | 4/2016 |
| KR | 10-2016-0147499 A | 12/2016 |
| KR | 10-2018-0031120 A | 3/2018 |
| KR | 10-2018-0113220 A | 10/2018 |
| KR | 10-2018-0115312 A | 10/2018 |
| KR | 10-2019-0061795 A | 6/2019 |
| KR | 10-2020-0008644 A | 1/2020 |
| KR | 10-2020-0008647 A | 1/2020 |
| KR | 10-2020-0052092 A | 5/2020 |
| KR | 10-2020-0131731 A | 11/2020 |
| KR | 10-2021-0015559 A | 2/2021 |
| KR | 10-2021-0069598 A | 6/2021 |

OTHER PUBLICATIONS

Written Opinion dated Aug. 26, 2022, issued in International Application No. PCT/KR2022/007212.
Extended European Search Report dated Sep. 5, 2024, issued in European Application No. 22825163.3-1201.
Korean Office Action Mar. 31, 2025, issued in Korean Application No. 10-2021-0076961.

* cited by examiner

ELECTRONIC DEVICE INCLUDING ANTENNA MODULE

CROSS-REFERENCE TO RELATED APPLICATION(S)

This application is a continuation application, claiming priority under § 365(c), of an International application No. PCT/KR2022/007212, filed on May 20, 2022, which is based on and claims the benefit of a Korean patent application number 10-2021-0076961, filed on Jun. 14, 2021, in the Korean Intellectual Property Office, the disclosure of which is incorporated by reference herein in its entirety.

TECHNICAL FIELD

The disclosure relates to an arrangement and coupling of structures included in an electronic device to enhance waterproof performance and antenna performance.

BACKGROUND ART

Advancing information communication and semiconductor technologies accelerate the spread and use of various electronic devices. In particular, recent electronic devices are being developed to carry out communication while carried on.

The term "electronic device" may mean a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, etc. For example, electronic devices may output stored and/or transmitted information as sounds or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

As recent trends are toward compact, slim, and high-density electronic products, metal frames or elements included in electronic products are made compact and slim. Depending on the characteristics of metal, the metal frame or elements may be formed of various types of metallic materials.

The above information is presented as background information only to assist with an understanding of the disclosure. No determination has been made, and no assertion is made, as to whether any of the above might be applicable as prior art with regard to the disclosure.

DISCLOSURE

Technical Problem

An electronic device may provide various functions to the user through wireless communication. The electronic device may include antennas of various shapes or structures for communication through various frequencies. According to the conventional technology, there may be many difficulties in securing a space for installing an antenna in an electronic device, e.g., a mobile communication terminal. For example, due to its reduced size, it may be difficult to secure a sufficient physical spacing between circuit devices and antennas. Further, if a radiator included as at least a portion of the antenna is placed close to the surface of the electronic device, it is possible to secure a physical spacing between the radiator included as at least part of the antenna and circuit devices (e.g., a printed circuit board (PCB) line, a PCB ground, a semiconductor chip, a resistor, a capacitor, or an inductor), but radiation performance may be distorted due to the human body.

A general electronic device has an external appearance, and the external appearance of the electronic device may be affected by the material or arrangement of components. As part of the exterior of the electronic device, a plurality of members related to the exterior may be included. For example, a display, a receiver, or a front camera may be disposed on the front surface of the exterior of the electronic device, and a rear camera, a flash, and a speaker hole may be disposed on the rear surface of the exterior. Further, a side key, a universal serial bus (USB) connector, an earphone jack connector, a microphone hole, and the like may be disposed on the side surface of the electronic device. The arrangement of the components may be changed according to the exterior design of the electronic product.

The components related to the exterior, disposed on the electronic device, may have exterior members. For example, among the exterior members, a movable exterior member performing a physical pressing action or an exterior member having a hole for insertion may have weak waterproofing. As another example, the volume control key or the power key disposed on the side surface of the electronic device may be movably disposed with the key top exposed to the outside. A gap may occur between the moving member and the case frame and may cause penetration of a foreign body, such as moisture, into the electronic device, damaging, e.g., the substrate.

Aspects of the disclosure are to address at least the above-mentioned problems and/or disadvantages and to provide at least the advantages described below. Accordingly, an aspect of the disclosure is to provide an electronic device having a superior waterproofing structure while securing antenna performance.

In the case of the conventional coupling, a metal housing (hereinafter, 'metal') forming the exterior of the electronic device and a shape for the coupling structure are required, so that, for waterproofing and rigidity, a segment formed of one injection molding material is required, and the antenna radiation range is limited, resulting in a space limit in design. The presence of metal may interfere with the radiation range of the antenna, and the glass supporting the antenna module, the metal and the segment may not provide sufficient waterproofing.

In the conventional way of equipping an antenna, the material surrounding the periphery may be formed into a single material to secure the reliability of the instrument structure, such as waterproofing performance. For example, if a single material with about 45% polybutylene terephthalate (PBT)/glass fiber (GF) and a dielectric constant of about 3.5 is used, a margin for securing antenna performance may be insufficient.

Through the disclosure, for waterproofing and rigidity, two injection molded members formed of different injection molding materials may be coupled to the area bonded to the metal, and the dielectric constants of the injection molded members may be different from each other. The material that is bonded to the metal at the inside supplements the mechanical rigidity, preventing cracks and reinforcing the rigidity. The material bonded to the metal at the outside may increase the dielectric constant, unlike the internal material, and thus help secure antenna performance.

Materials having different dielectric constants may be applied to the plurality of injection molded members, and different raw materials may be applied thereto. When different raw materials are applied, chemical bonding may not be completely achieved during injection molding. Therefore, a physical coupling structure is formed to secure mechanical rigidity.

Additional aspects will be set forth in part in the description which follows and, in part, will be apparent from the description, or may be learned by practice of the presented embodiments.

Technical Solution

In accordance with an aspect of the disclosure, a portable electronic device is provided. The portable electronic device includes a metal housing, an antenna module positioned in the metal housing, a first injection-molded member positioned in a radiation direction of the antenna module and having a first dielectric constant, a second injection-molded member at least partially in contact with the first injection-molded member, positioned in the radiation direction of the antenna module, and having a second dielectric constant different from the first dielectric constant, and a first organic film disposed along an inner surface of the metal housing to bond with at least a portion of the first injection-molded member. The second injection-molded member may form, together with the metal housing, an exterior of the portable electronic device. The second injection-molded member may be coupled with the first injection-molded member through a coupling structure in which one of the first injection-molded member or the second injection-molded member is at least partially protruding into another one of the first injection-molded member or the second injection-molded member.

In accordance with another aspect of the disclosure, an electronic device is provided. The electronic device includes a metal housing, an antenna module positioned in the metal housing, a first injection-molded member including an inorganic material and having a first dielectric constant, and a second injection-molded member having a second dielectric constant higher than the first dielectric constant. The second injection-molded member may form, together with the metal housing, an exterior of the portable electronic device. The second injection-molded member may be at least partially bonded with the first injection-molded member through a coupling structure with the first injection-molded member.

Advantageous Effects

According to various embodiments of the disclosure, as the first injection-molded member and the second injection-molded member are positioned in the radiation direction of the antenna module, it is possible to secure antenna radiation performance.

According to various embodiments of the disclosure, it is possible to provide high rigidity through a coupling structure between the first injection-molded member and the second injection-molded member having different dielectric constants.

According to various embodiments of the disclosure, it is possible to provide high waterproofing performance due to the second injection-molded member present on the exterior of the portable electronic device.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
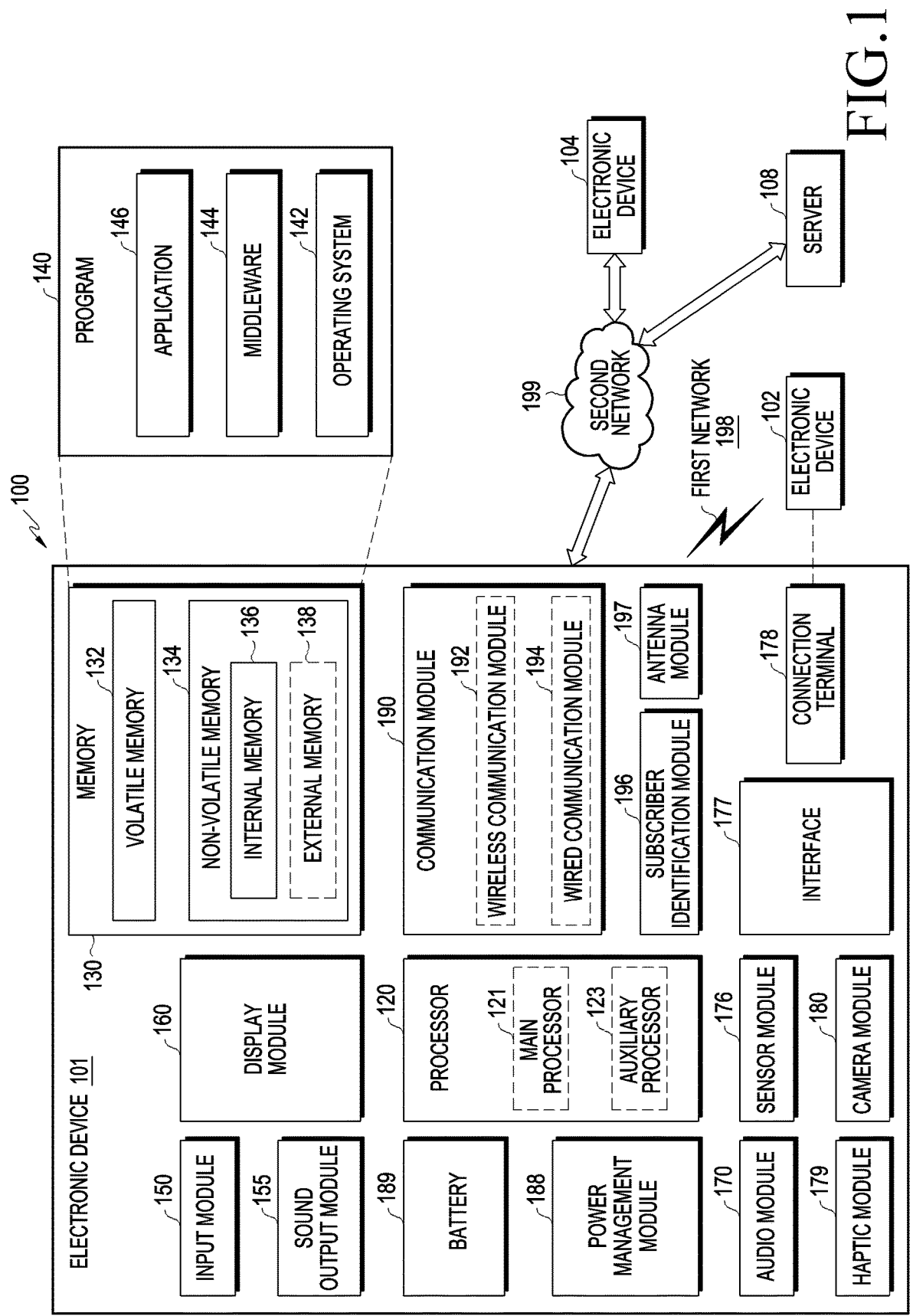
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one (e.g., the connection terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5th generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify and/or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
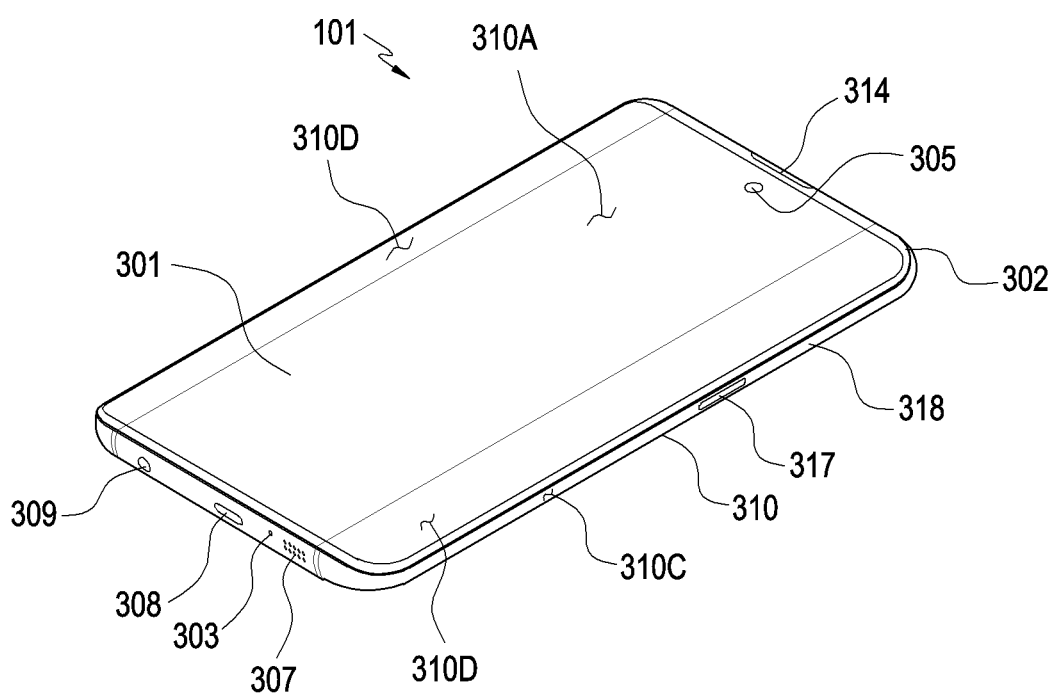
FIG. 2 is a front perspective view illustrating an electronic device according to an embodiment of the disclosure.
Figure 3:
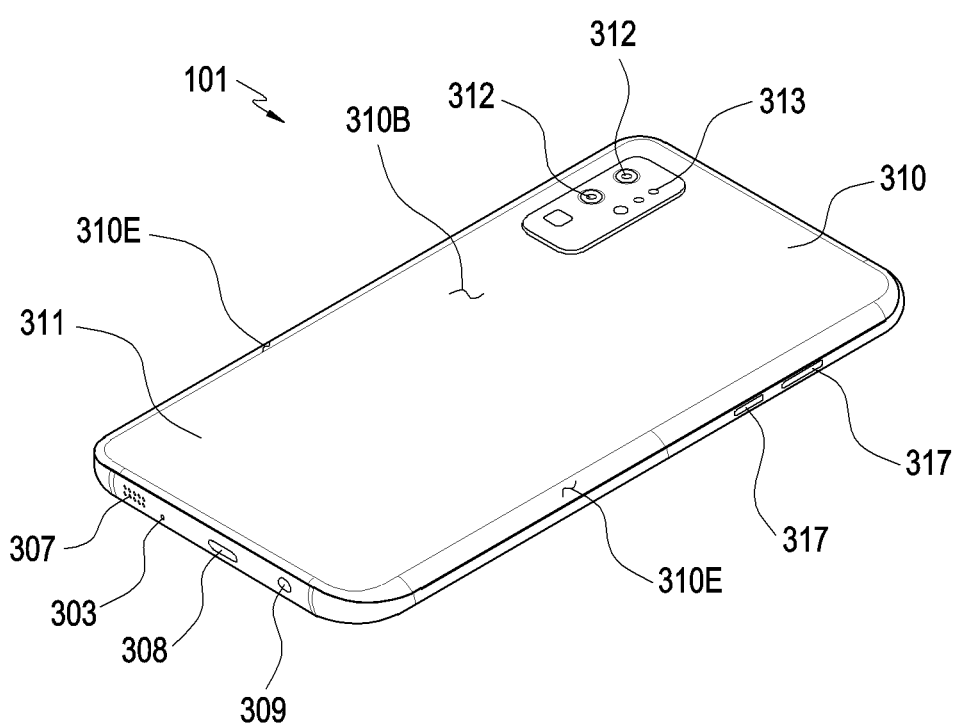
FIG. 3 is a rear perspective view illustrating an electronic device according to an embodiment of the disclosure.

FIG. 2 is a front perspective view illustrating an electronic device according to an embodiment of the disclosure. FIG. 3 is a rear perspective view illustrating an electronic device according to an embodiment of the disclosure.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A, the rear surface 310B, and the side surface 310C of FIG. 2. According to an embodiment, at least part of the front surface 310A may have a substantially transparent front plate 302 (e.g., a glass plate or polymer plate including various coat layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel structure 318 may be integrally formed together and include the same material (e.g., glass, metal, such as aluminum, or ceramic).

In the embodiment illustrated, the front plate 302 may include two first edge areas 310D, which seamlessly and bendingly extend from the front surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310D (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301 (e.g., the display module 160 of FIG. 1), audio modules 303, 307, and 314 (e.g., the audio module 170 of FIG. 1), a sensor module (e.g., the sensor module of FIG. 1). 176), camera modules 305, 312, and 313 (e.g., the camera module 180 of FIG. 1), a key input device 317 (e.g., the input module 150 of FIG. 1), and connector holes 308 and 309 (e.g., the connection terminal 178 of FIG. 1). According to an embodiment, the electronic device 101 may exclude at least one (e.g., the connector hole 309) of the components or may add other components.

According to an embodiment, the display 301 may be visually exposed through, e.g., a majority portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to an embodiment, a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to another embodiment (not shown), at least one or more of the audio module 314, sensor module (not shown), camera module 305, fingerprint sensor (not shown), and light emitting device (not shown) may be included on the rear surface of the screen display area of the display 301.

According to an embodiment, at least one camera module 305 and 312 may be disposed under the display 301. For example, the first camera module 305 may be disposed in at least a partial area of the display 301 corresponding to a camera field of view (FOV). As the first camera module 305 is disposed in at least a partial area of the display 301 corresponding to the camera field of view (FOV), the position of the first camera module 305 may not be visually distinguished (or exposed). According to an embodiment, when the display 301 is viewed from the front surface 310A, the first camera module 305 is disposed in a portion corresponding to the camera field of view (FOV), which is at least a portion of the display 301, so that the first camera module 305 may obtain an image of the external subject while not being visually exposed to the outside. For example, the first camera module 305 may be an under display camera (UDC).

In an embodiment, the electronic device 101 may include a display (not shown) that is slidably disposed and provides a screen (e.g., a display area). For example, the display area of the electronic device 101 may be an area that is visually exposed and enables an image to be output. In one example, the electronic device 101 may adjust the display area according to the movement of a sliding plate (not shown) or the movement of the display. For example, the electronic device 101 may include a rollable electronic device configured to selectively expand the display area as at least a portion (e.g., the housing 310) of the electronic device 101 is operated to be at least partially slidable. The above-described display 301 may be referred to as, e.g., a slide-out display or an expandable display.

According to another embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., a heart rate monitor (HRM) sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment, the camera modules 305, 312, and 313 may include a first camera module 305 disposed on the front surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. For example, at least one of the plurality of camera modules 305 and 312 may be a wide-angle camera and at least another of the plurality of camera modules may be a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module (not shown) disposed on the rear surface 310B of the housing 310.

According to an embodiment, the light emitting device (not shown) may be disposed on, e.g., the front surface 310A of the housing 310. The light emitting device (not shown) may provide, e.g., information about the state of the electronic device 101 in the form of light. According to another embodiment, the light emitting device (not shown) may provide a light source that interacts with, e.g., the front camera module 305. The light emitting device (not shown) may include, e.g., a light emitting device (LED), an infrared (IR) LED, and/or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

According to an embodiment, some of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the camera module 312 may be disposed inside the housing 310 so that the lens is exposed to the rear surface 310B of the electronic device 101. For example, the camera module 312 may be disposed on a printed circuit board (e.g., the printed circuit board 340 of FIG. 4).

According to an embodiment, the camera module 305 and/or the sensor module may be disposed to contact with the external environment through a transparent area from the internal space of the electronic device 101 to the front plate 302 of the display 301. Further, some sensor module (not shown) may be disposed to perform its functions without being visually exposed through the front plate 302 in the internal space of the electronic device.

Figure 4:
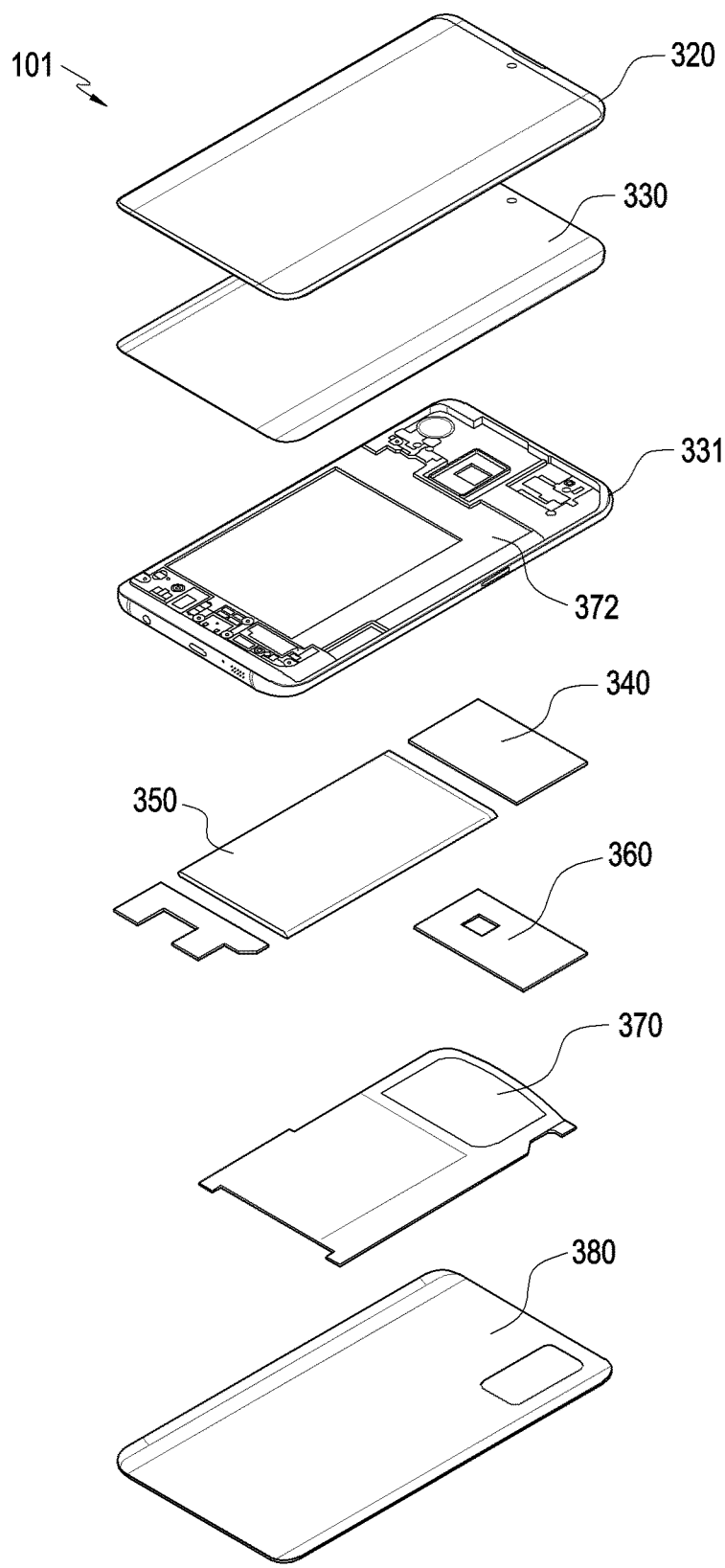
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, according to various embodiments, an electronic device 101 (e.g., the electronic device 101 of FIGS. 1 to 3) may include a side bezel structure 331 (e.g., the side bezel structure 318 of FIG. 2), a first supporting member 372, a front plate 320 (e.g., the front plate 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear case), an antenna 370 (e.g., the antenna module 197 of FIG. 1), and a rear plate 380 (e.g., the rear plate 311 of FIG. 2). According to an embodiment, the electronic device 101 may exclude at least one (e.g., the first supporting member 372 or second supporting member 360) of the components or may add other components. At least one of the components of the electronic device 101 may be the same or similar to at least one of the components of the electronic device 101 of FIG. 2 or 3 and no duplicate description is made below.

According to various embodiments, the first supporting member 372 may be disposed inside the electronic device 101 to be connected with the side bezel structure 331 or integrated with the side bezel structure 331. The first supporting member 372 may be formed of, e.g., a metal and/or non-metallic material (e.g., polymer). The display 330 may be joined onto one surface of the first supporting member 372, and the printed circuit board 340 may be joined onto the opposite surface of the first supporting member 372.

According to various embodiments, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 372 and may be electrically connected with an antenna module (e.g., the antenna module 197 of FIG. 1) and a communication module (e.g., the communication module 190 of FIG. 1).

According to an embodiment, the memory (e.g., the memory 130 of FIG. 1) may include, e.g., a volatile or non-volatile memory.

According to an embodiment, the interface (e.g., the interface 177 of FIG. 1) may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to various embodiments, the battery 350 (e.g., the battery 189 of FIG. 1) may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear case) may be disposed between the printed circuit board 340 and the antenna 370. For example, the second supporting member 360 may include one surface to which at least one of the printed circuit board 340 and the battery 350 is coupled, and another surface to which the antenna 370 is coupled.

According to various embodiments, the antenna 370 (e.g., the antenna module 197 of FIG. 1) may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 372.

According to various embodiments, the rear plate 380 may form at least a portion of the rear surface (e.g., the rear surface 310B of FIG. 3) of the electronic device 101.

Figure 5:
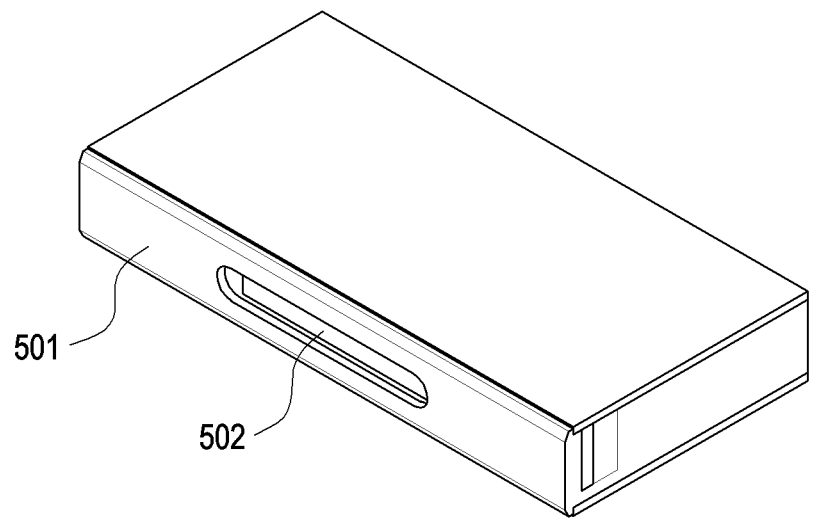
FIG. 5 illustrates an exterior of an antenna module according to an embodiment of the disclosure.

FIG. 5 illustrates an exterior of an antenna module according to an embodiment of the disclosure.

Referring to FIG. 5, a metal 501 and a module stack structure 502 forming the exterior of the electronic device 101 are illustrated. The disclosure proposes an instrument structure optimized for enhancing antenna performance and securing waterproofing performance.

Figure 6:
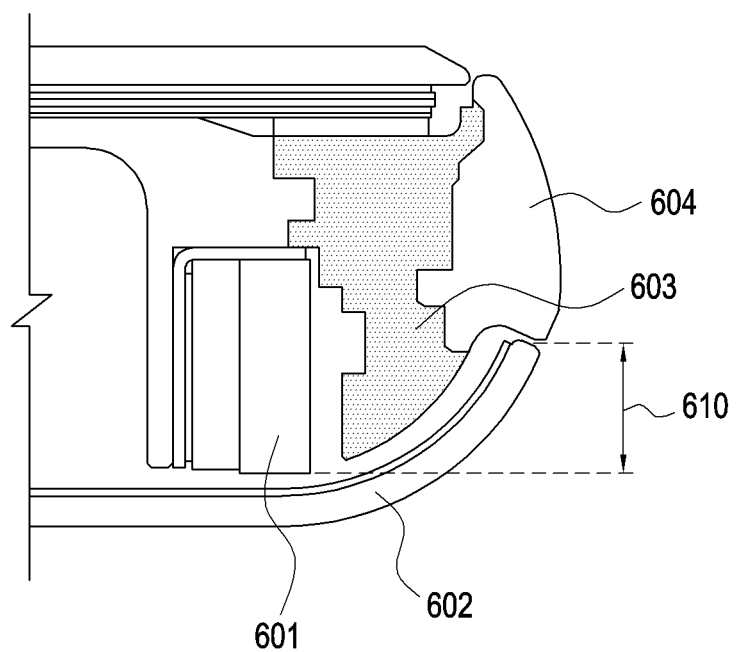
FIG. 6 illustrates a conventional structure including an antenna module according to an embodiment of the disclosure.

FIG. 6 illustrates a conventional structure including an antenna module according to an embodiment of the disclosure.

Figure 7:
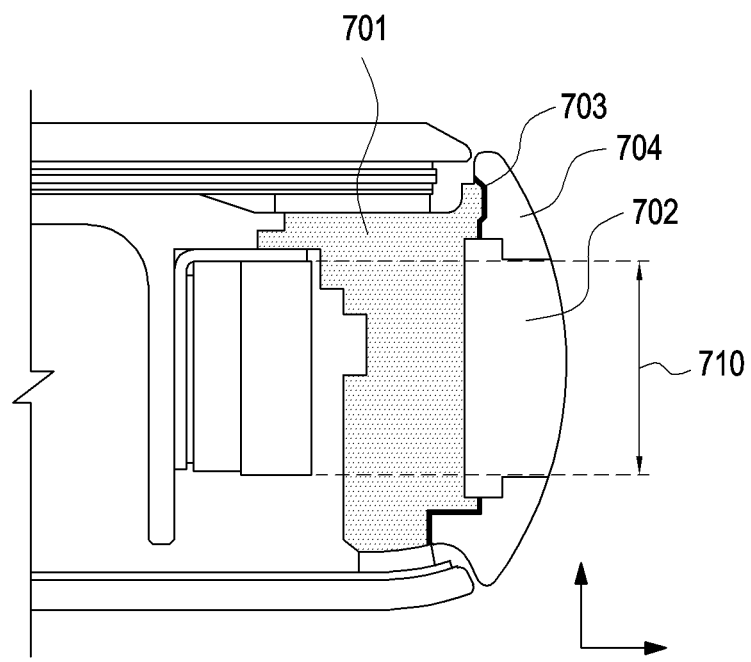
FIG. 7 illustrates an enhanced structure for securing antenna performance according to an embodiment of the disclosure.

FIG. 7 illustrates an enhanced structure for securing antenna performance according to an embodiment of the disclosure.

Referring to FIG. 6, the conventional structure of the module stack structure 502 includes an antenna module (e.g., 601 of FIG. 6), a lower glass (e.g., the back glass 602 of FIG. 6) positioned in an area including the radiation direction, under the antenna module (e.g., 601 of FIG. 6), a metal (e.g., 604 of FIG. 6) forming the exterior of the electronic device 101, and an injection-molded member (e.g., 603 of FIG. 6) positioned between the antenna module (e.g., 601 of FIG. 6) and the metal (e.g., 604 of FIG. 6).

According to various embodiments, the injection-molded member (e.g., 603 of FIG. 6) included in the conventional structure contains glass fiber as a thermoplastic resin. The glass fiber plays a role to increase the rigidity of the material to secure the strength of the device and to reduce shrinkage to secure durability and set deformation and/or prevent set damage to thereby secure waterproofing performance. Further, the material surrounding the periphery of the module stack structure 502, which is the antenna mounting structure, is formed into a single material to secure reliability of the instrument structure, such as waterproofing performance.

According to various embodiments, to increase the performance of the antenna, it is necessary to secure an antenna performance influence section (e.g., 610 of FIG. 6). Due to the conductive metal (e.g., 604 in FIG. 6), the antenna performance influence section (e.g., 610 of FIG. 6) may be partially limited. If a broader area is secured as the radiation area using a non-conductive injection-molded material, the performance of the antenna may be enhanced.

According to various embodiments, the performance of the antenna may be related to the dielectric constant of the injection-molded member (e.g., 603 of FIG. 6). As a raw material (e.g., high molecular polymer or resin) of the injection-molded member (e.g., 603 of FIG. 6), a material having a dielectric constant of about 2.0 to 3.5 may be used, and it may contain an inorganic material. The glass fiber has a dielectric constant between about 7.2 and 7.3. Thus, if the proportion of the glass fiber is increased, the dielectric constant increases. In the case of a resin having a dielectric constant of about 3.8, a reference cumulative distribution function (CDF) value in the carrier's frequency band (e.g., n261) is 18.4 dbm, and it is experimentally identified that it is increased by about 0.48 dbm, thereby enhancing the antenna performance. The CDF may be a 5G antenna performance evaluation measurement scheme. In general, a measurement value of about 50% may be used as a reference for determining the performance of the terminal. In other words, CDF 50% means that the performance of all 5G antenna beams is measured and, under the assumption that the total number of beams is 100, the antenna performance may be simulated for each dielectric constant through the equivalent isotropic radiated power (EIRP), which is the output power value of one beam with the 50th best performance. As an example, the gain for the antenna performance may be derived by performing simulation per dielectric constant for each of a plurality of frequency bands (e.g., n258 and n261). As the dielectric constant is gradually increased, it may be identified that the sum of the gain values is increased, which may be advantageous in securing performance. When the dielectric constant of the injection-molded member (e.g., 603 of FIG. 6) is increased, the antenna performance may be enhanced. However, the fluidity of the resin is decreased, so that it is required to increase the temperature of injection molding. The increase in temperature may cause carbonization and poor appearance. Further, to enhance the fluidity of the resin and prevent injection molding at high temperature, a ceramic-based inorganic material, such as zirconia and alumina, having a particle size smaller than that of glass fiber may be added. If the inorganic material is added, fluidity may be better than that of glass fiber, but the ceramic-based inorganic material has a problem of having lower impact resistance and rigidity than that of glass fiber. If the rigidity is low, a crack may occur due to a fall, and it may be difficult to secure waterproofing performance. An enhanced structure may be described with reference to FIG. 7 so as to reinforce rigidity and waterproofing characteristics while securing the performance of the antenna.

Referring to FIG. 7, an enhanced structure inside the module stack structure 502 includes an antenna module (e.g., 601 of FIG. 6), a lower glass (e.g., the back glass 602 of FIG. 6) positioned in an area under the antenna module (e.g., 601 of FIG. 6), a metal housing (e.g., 704 of FIG. 7) forming the exterior of the electronic device 101, and a first injection-molded member (e.g., 701 of FIG. 7) positioned between the antenna module (e.g., 601 of FIG. 6) and the metal housing (e.g., 704 of FIG. 7). The electronic device 101 includes the metal housing (e.g., 704 of FIG. 7) and a second injection-molded member (e.g., 702 of FIG. 7) at the periphery of the electronic device 101.

According to various embodiments, the description of FIG. 6 may be applied to the antenna module (e.g., 601 of FIG. 6) and the lower glass (e.g., the back glass 602 of FIG. 6). In FIG. 7, the antenna module (e.g., 601 of FIG. 6) may be spaced, a predetermined interval, apart from the lower glass (e.g., the back glass 602), as compared with the conventional structure (e.g., FIG. 6), so as to secure a radiation area (e.g., 710 of FIG. 7). For the antenna module (e.g., 601 of FIG. 6), the first injection-molded member (e.g., 701 of FIG. 7) and the second injection-molded member (e.g., 702 of FIG. 7) placed on the radiation area (e.g., 710 of FIG. 7) may be said to be mounted in the x-axis direction. For each component, the injection-molded members may be mounted with respect to the x-axis direction, such as the antenna module (e.g., 601 of FIG. 6), to minimize the loss of waterproofing and antenna radiation performance, and the area of the conductive metal housing (e.g., 704 of FIG. 7) may be minimized.

According to various embodiments, the metal housing (e.g., 704 of FIG. 7) may be bonded to the two injection-molded members. The two injection-molded members may have different dielectric constants. The first injection-molded member (e.g., 701 of FIG. 7) bonded inside the metal housing (e.g., 704 of FIG. 7) may supplement the mechanical rigidity, preventing cracks and reinforcing rigidity. The first injection-molded member (e.g., 701 of FIG. 7) bonded inside the metal housing (e.g., 704 of FIG. 7) may form a first organic film (e.g., 703 of FIG. 7). The second injection-molded member (e.g., 702 of FIG. 7) that, together with the metal housing (e.g., 704 of FIG. 7), forms the exterior of the electronic device 101 and is bonded to the metal housing (e.g., 704 of FIG. 7) may play a role to increase the dielectric constant over the first injection-molded member (e.g., 701 of FIG. 7) to secure antenna performance. The second injection-molded member (e.g., 702 of FIG. 7) bonded to the metal housing (e.g., 704 of FIG. 7) may form a second organic film (not shown) on at least a portion of the bonding surface. The first organic film (e.g., 704 of FIG. 7) may be formed through a TRI process, and the second organic film (not shown) may be formed after the first organic film (e.g., 704 of FIG. 7) is formed. The first organic film or the second organic film included in the metal housing (e.g., 704 of FIG. 7) may enhance bonding strength between the metal housing (e.g., 704 of FIG. 7) and the injection-molded member.

According to various embodiments, the metal housing (e.g., 704 of FIG. 7) may be formed symmetrically with respect to the x-axis to not interfere with the radiation area (e.g., 710 of FIG. 7). It may be seen that the radiation area (e.g., 710 of FIG. 7) has a wider section than the antenna performance influence section (e.g., 610 of FIG. 6) in the conventional structure (e.g., FIG. 6).

According to various embodiments, the description of the injection-molded member (e.g., 603 of FIG. 6) of FIG. 6 may be applied to the first injection-molded member (e.g., 701 of FIG. 7). The first injection-molded member may be mounted inside the metal housing (e.g., 704 of FIG. 7) and may form the metal housing (e.g., 704 of FIG. 7) and the first organic film (e.g., 703 of FIG. 7). The first injection-molded member (e.g., 701 of FIG. 7) may include a thermoplastic resin and an inorganic material (e.g., primary PBT, secondary PC). The inorganic material may increase the rigidity of the injection-molded member to secure the rigidity of the device and may reduce shrinkage to reduce set deformation. Further, the inorganic material may secure the durability of the device and prevent damage to the device to secure waterproofing performance. If the content of the inorganic material is increased, the fluidity of the injection-molded product may decrease, so that difficulty may occur in injection molding due to insufficient fluidity. If the temperature is raised to increase fluidity, carbonization and poor appearance may occur. To secure the rigidity of the instrument of the module stack structure 502, waterproofing performance, and antenna performance, the first injection-molded member (e.g., 701 of FIG. 7) present therein may include a material having a predetermined degree of rigidity or more using an inorganic material, and the first injection-molded member (e.g., 701 of FIG. 7) may be bonded to the metal housing (e.g., 704 of FIG. 7) and implement mechanical rigidity while implementing waterproofing performance. The resin applied to the first injection-molded member (e.g., 701 of FIG. 7) may contain about 30% or more of an inorganic material, such as glass fiber, to secure mechanical rigidity and prevent shrinkage. The first injection-molded member (e.g., 701 of FIG. 7) may form a coupling structure (or an interlocked structure) for coupling with the second injection-molded member (e.g., 702 of FIG. 7) having a different dielectric constant.

According to various embodiments, the second injection-molded member (e.g., 702 of FIG. 7) may use a material having a higher dielectric constant than the first injection-molded member (e.g., 701 of FIG. 7) to enhance antenna performance. The second injection-molded member (e.g., 702 of FIG. 7), as a component for securing antenna performance, may have a composition different from the material used for the first injection-molded member (e.g., 701 of FIG. 7). The resin raw material base of the second injection-molded member (e.g., 702 of FIG. 7) may include, e.g., polycarbonate, poly butylene terephthalate, or poly phenylene sulfide. The inorganic material may also include, e.g., glass fiber, talc, wollastonite, and ZrO2. The second injection-molded member (e.g., 702 of FIG. 7) is applied differently in at least one of the components included in the inorganic material and raw material base or be different in composition from the first injection-molded member (e.g., 701 in FIG. 7).

According to various embodiments, the basic dielectric constant of each material may be as follows. As examples that may be used as raw materials, polycarbonate may have a dielectric constant of about 2.9 to 3.0, polypropylene may have a dielectric constant of about 2.1 to 2.2, modified poly phenylene oxide may have a dielectric constant of about 2.0 to 2.1, poly butylene terephthalate may have a dielectric constant of about 3.0 to 3.2, and poly phenylene sulfide may have a dielectric constant of about 3.1 to 3.3. As example that may be the inorganic material, glass fiber may have a dielectric constant of about 7.2 to 7.3, minerals, such as talc/wollastonite, may have a dielectric constant of about 4.5 to 6.5, and ZrO2 (ceramic-based materials, such as zirconia) may have a dielectric constant of about 4.6 to 5.0. There is a difference in intrinsic dielectric constant of each raw material and inorganic material. Based on this difference, a material is made with a different composition from the first injection-molded member (e.g., 701 of FIG. 7), so as to utilize the second injection-molded member (e.g., 702 of FIG. 7) having a different dielectric constant from the first injection-molded member (e.g., 701 of FIG. 7), and the antenna characteristics may be optimized by increasing the dielectric constant of the second injection-molded member (e.g., 702 of FIG. 7).

According to various embodiments, since injection-molded members having different dielectric constants are difficult to completely chemically couple during injection molding, it is possible to secure mechanical rigidity by forming a physical coupling structure (or interlocked structure).

Figure 8A:
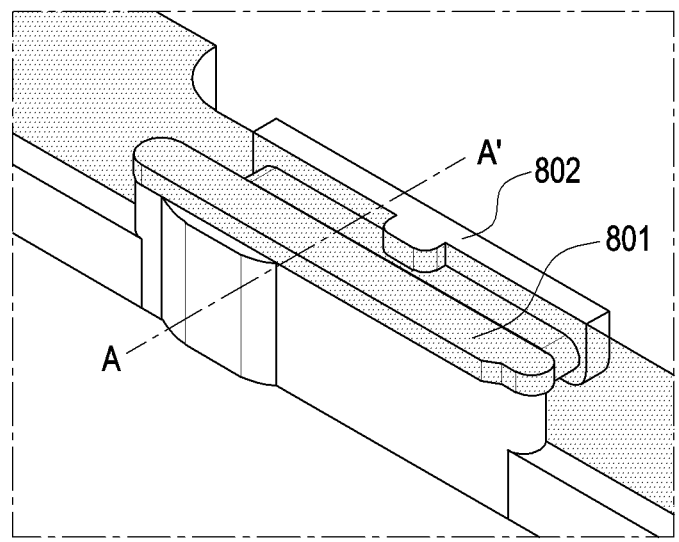
FIGS. 8A, 8B, and 8C illustrate a coupling structure of an injection-molded member according to various embodiments of the disclosure.
Figure 8B:
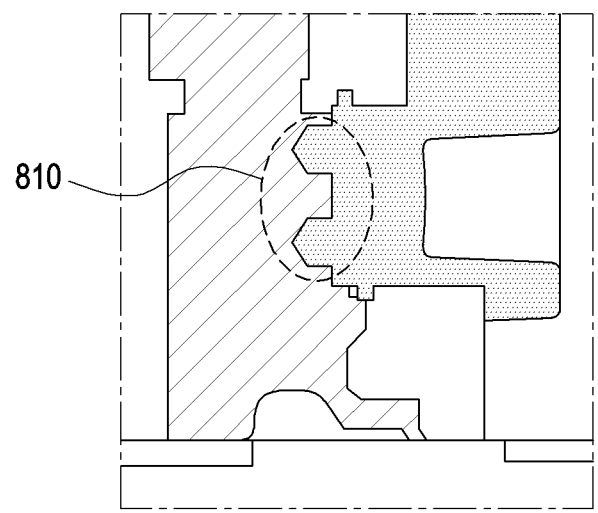
Figure 8C:
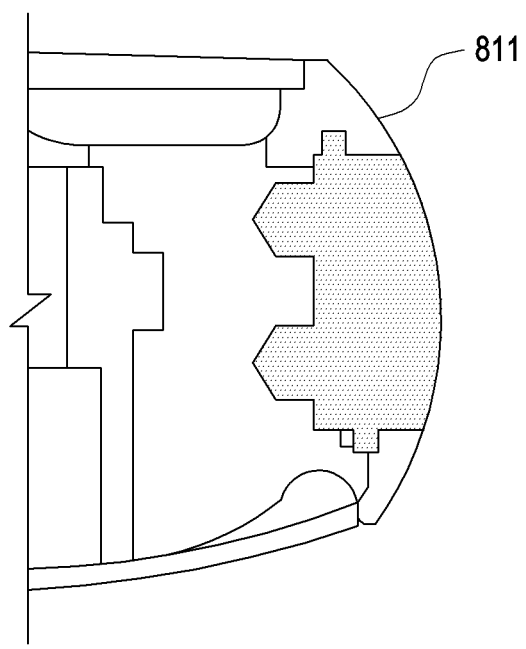

FIGS. 8A, 8B, and 8C illustrate a coupling structure of an injection-molded member according to various embodiments of the disclosure.

Figure 9A:
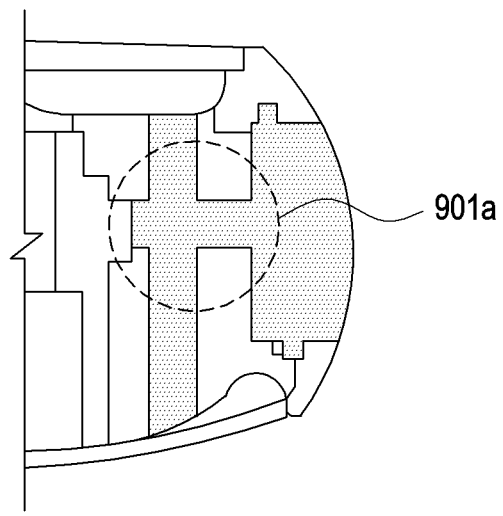
FIGS. 9A, 9B, and 9C illustrate a coupling structure of an injection-molded member according to various embodiments of the disclosure.
Figure 9B:
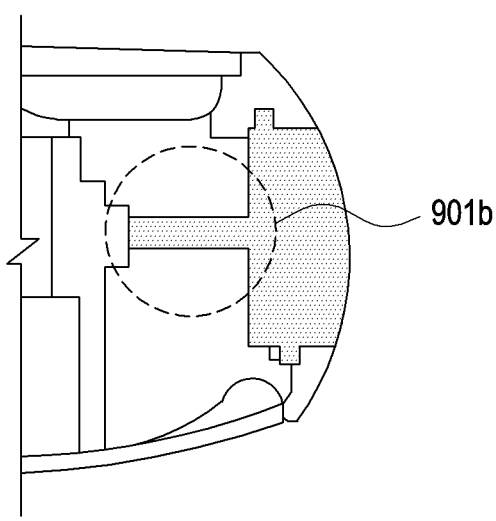
Figure 9C:
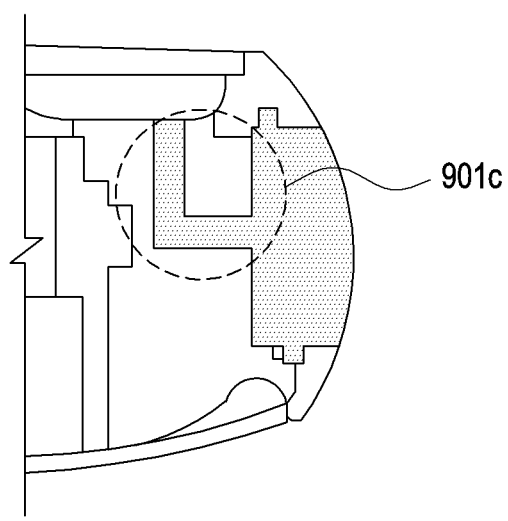

FIGS. 9A, 9B, and 9C illustrate a coupling structure of an injection-molded member according to various embodiments of the disclosure.

Figure 10:
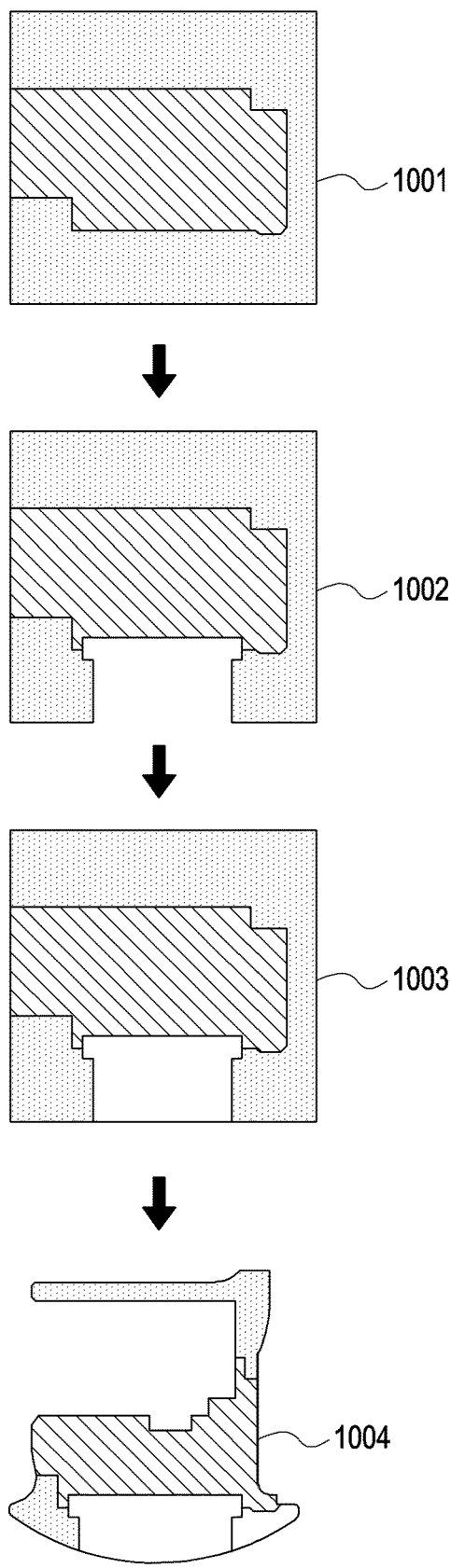
FIG. 10 illustrates a manufacturing process using injection-molding materials with different dielectric constants according to an embodiment of the disclosure.

FIG. 10 illustrates a manufacturing process using injection-molding materials with different dielectric constants according to an embodiment of the disclosure.

Figure 12:
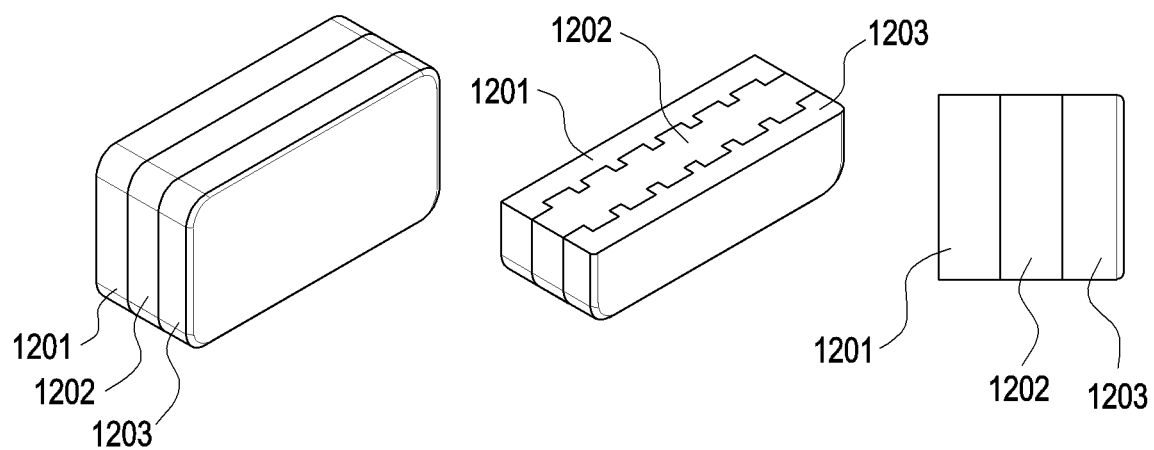
FIG. 12 illustrates a coupling structure of a first injection-molded member and a second injection-molded member, according to an embodiment of the disclosure.

FIG. 12 illustrates a coupling structure of a first injection-molded member and a second injection-molded member, according to an embodiment of the disclosure.

According to various embodiments, the structure of the module stack structure 502 is illustrated at the outside of the electronic device 101. FIG. 8A illustrates a metal housing and a second injection-molded member (e.g., 702 of FIGS. 7 and 802 of FIG. 8A) exposed to the outside of the electronic device 101 and illustrates a first injection-molded member (e.g., 701 of FIG. 7 or 801 of FIG. 8A) positioned inside the electronic device 101. The description of FIGS. 5 to 7 may be applied to the first injection-molded member (e.g., 801 of FIG. 8A) and the second injection-molded member (e.g., 802 of FIG. 8A). FIG. 8B is a cross-sectional view taken along AA' of FIG. 8A, illustrating a coupling structure (e.g., 810 of FIG. 8A) of the first injection-molded member (e.g., 701 of FIG. 7 or 801 of FIG. 8A) and a second injection-molded member (e.g., 702 of FIG. 7 or 802 of FIG. 8A). FIG. 8C illustrates a cross-section of the finished product.

According to various embodiments, the coupling structure (e.g., 810 of FIG. 8B) is applied to the coupling of two injection-molded members having different dielectric constants and different raw material bases to ensure the durability of the device. It is shown that the coupling structure may be formed in various forms (e.g., 901a, 901b, and 901c) in FIGS. 9A to 9C. FIG. 8C is a cross-sectional view of the finished product 811, which may include various types of coupling structures (e.g., 810 of FIG. 8B, 901a of FIG. 9A, 901b of FIG. 9B, or 901c of FIG. 9C) mentioned above, between the plurality of injection-molded members. For example, the coupling structure (e.g., 810 of FIG. 8A) may be formed so that the first injection-molded member (e.g., 701 of FIG. 7 or 801 of FIG. 8A) protrudes into the second injection-molded member (e.g., 702 of FIG. 7 or 802 of FIG. 8A) so that the second injection-molded member (e.g., 702 of FIG. 7 or 802 of FIG. 8A) surrounds the first injection-molded member (e.g., 701 of FIG. 7 or 801 of FIG. 8A). For example, the coupling structure (e.g., 810 of FIG. 8A) may be formed so that the second injection-molded member (e.g., 702 of FIG. 7 or 802 of FIG. 8A) protrudes into the first injection-molded member (e.g., 701 of FIG. 7 or 801 of FIG. 8A) so that the first injection-molded member (e.g., 701 of FIG. 7 or 801 of FIG. 8A) surrounds the second injection-molded member (e.g., 702 of FIG. 7 or 802 of FIG. 8A). As an example, the coupling structure (e.g., 810 of FIG. 8B) may include a shape in which the second injection-molded member (e.g., 701 of FIG. 7 or 801 of FIG. 8A) penetrates the first injection-molded member (e.g., 702 of FIG. 7 or 802 of FIG. 8A). Various interlocked structures or coupling structures may be formed to supplement durability of the electronic device 101. If two injection-molded members with different dielectric constants are coupled in a face-to-face structure rather than in an interlocked structure, it may be observed with an optical microscope that micro gaps may occur between the injection-molded members, and if the instrument is dropped or tested for reliability, they may be separated at the bonding interface.

According to various embodiments, a process of manufacturing a module stack structure 502 formed of two injection-molded members having different dielectric constants may be described with reference to FIG. 10. The manufacturing process of FIG. 10 is described. First, a first injection-molded member is inserted into a metal housing (e.g., 604 of FIG. 6) (e.g., 1001 of FIG. 10), a mounting space where a second injection-molded member (e.g., 702 of FIG. 7) may be positioned is secured through CNC processing (e.g., 1002 of FIG. 10), the second injection-molded member (e.g., 702 of FIG. 7) with a different dielectric constant is inserted (e.g., 1003 of FIG. 10), and a shape may be formed by CNC processing to secure a mounting space where an antenna module (e.g., 601 of FIG. 6) may be positioned (e.g., 1004 of FIG. 10).

Figure 11A:
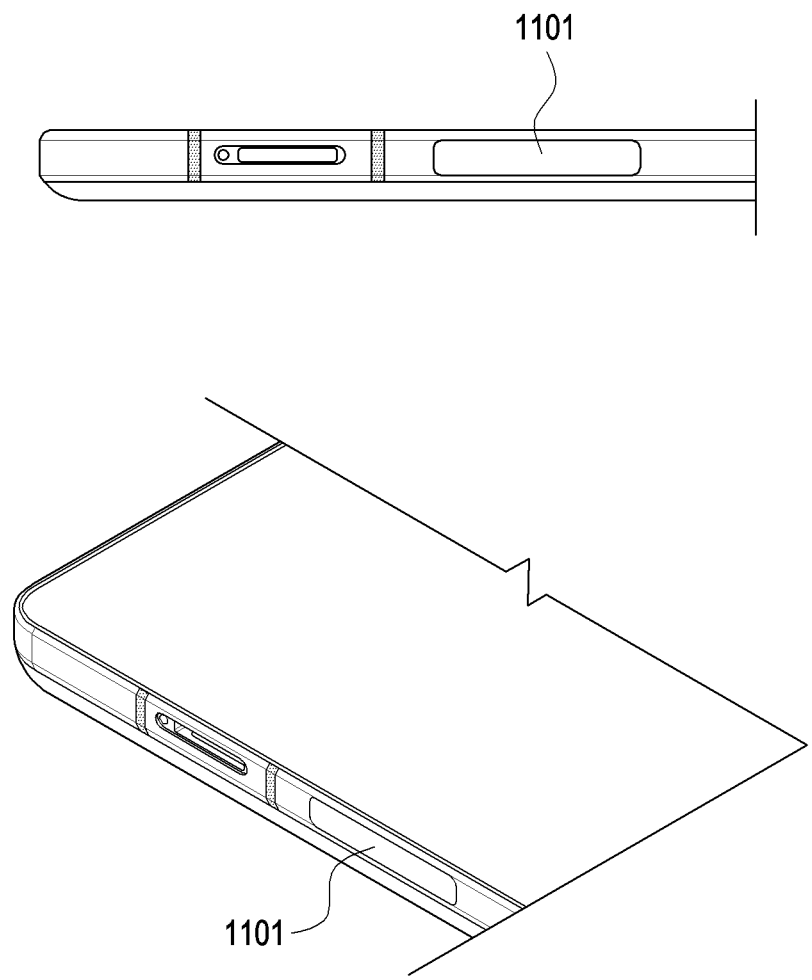
FIGS. 11A and 11B illustrate an antenna module stack structure where an additional component may be attached according to various embodiments of the disclosure.
Figure 11B:
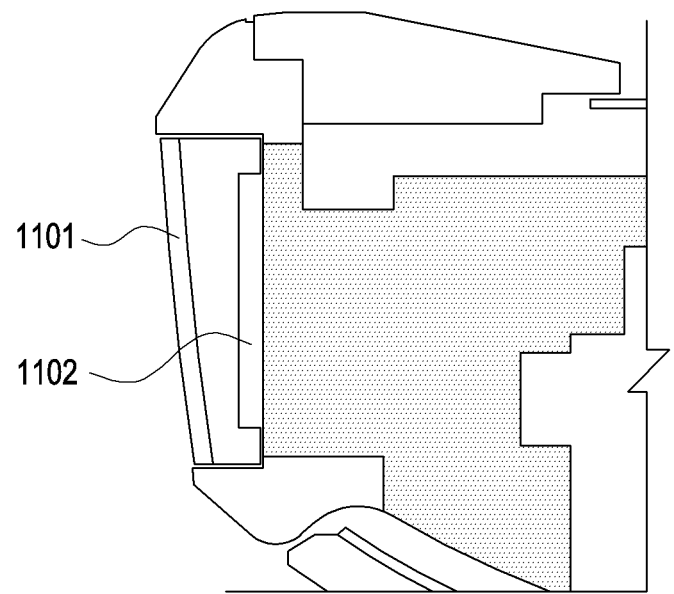

FIGS. 11A and 11B illustrate an antenna module stack structure where an additional component may be attached according to various embodiments of the disclosure.

According to various embodiments, the description of FIGS. 5 to 7 may be applied to the metal housing (e.g., 604 of FIG. 6), the first injection-molded member (e.g., 701 of FIG. 7), and the second injection-molded member (e.g., 702 of FIG. 7) included in the metal (e.g., 501 of FIG. 5) and the module stack structure (e.g., 502 of FIG. 5).

According to various embodiments, a film (e.g., 1101 of FIG. 11A) may be positioned outside the electronic device 101 for waterproofing, rigidity, or decorative purposes without forming a separate coupling structure with components inside the module stack structure (e.g., 502 of FIG. 5). The film may be attached onto the second injection-molded member (e.g., 702 of FIG. 7) exposed to the outside of the electronic device 101 through, e.g., painting/deposition. The film (e.g., 1101 of FIG. 11A) may implement various textures based on a metallic paint or vapor deposition. The film may include a plastic material to implement a metallic texture. The material (e.g., 1102 of FIG. 11B) and/or tape for bonding may be disposed, for bonding, between the first injection-molded member (e.g., 701 of FIG. 7) and the second injection-molded member (e.g., 702 of FIG. 7). The film (e.g., 1101 of FIG. 11A) is an example of the disclosure and may be formed of at least one of deposition and coating layers.

According to various embodiments, a plurality of injection-molded members having different dielectric constants may form the coupling structure as shown in FIG. 12. According to an embodiment, to form the module stack structure 502, a plurality of injection-molded members may be included. For example, a first injection-molded member (e.g., 1201 of FIG. 12), a second injection-molded member (e.g., 1202 of FIG. 12), and a third injection-molded member (e.g., 1203 of FIG. 12) may be coupled together. According to the disclosure, the first injection-molded member (e.g., 701 of FIG. 7) may be formed to surround the second injection-molded member (e.g., 702 of FIG. 7). Referring to FIG. 12, the border between the first injection-molded member and the second injection-molded member (e.g., 1201 and 1202 of FIGS. 12 or 1202 and 1203 of FIG. 12) may form a coupling structure in which the two injection-molded members with different dielectric constants are interlocked for durability.

According to various embodiments of the disclosure, there may be proposed a portable electronic device comprising a metal housing, an antenna module positioned in the metal housing, a first injection-molded member positioned in a radiation direction of the antenna module and having a first dielectric constant, a second injection-molded member at least partially in contact with the first injection-molded member, positioned in the radiation direction of the antenna module, and having a second dielectric constant different from the first dielectric constant, and a first organic film disposed along an inner surface of the metal housing to bond with at least a portion of the first injection-molded member, wherein the second injection-molded member forms, together with the metal housing, an exterior of the portable electronic device, and wherein the second injection-molded member is coupled with the first injection-molded member through a coupling structure in which one of the first injection-molded member or the second injection-molded member is at least partially protruding into another one of the first injection-molded member or the second injection-molded member.

According to various embodiments, the portable electronic device may further comprise a second organic film disposed along the inner surface of the metal housing to bond with at least a portion of the second injection-molded member.

According to various embodiments, the metal housing may be positioned on an upper end and a lower end of the second injection-molded member with respect to the radiation direction of the antenna module.

According to various embodiments, a composition ratio for a raw material and an inorganic material included in the first injection-molded member may differ from that of the second injection-molded member, and types for a raw material and an inorganic material included in the first injection-molded member may differ from those included in the second injection-molded member, and the first dielectric constant may differ from the second dielectric constant by a dielectric constant difference of 0.5 or more. The second injection-molded member may have a higher dielectric constant than the first injection-molded member.

According to various embodiments, in the coupling structure, the second injection-molded member may protrude into the first injection-molded member.

According to various embodiments, in the coupling structure, the first injection-molded member may protrude into the second injection-molded member.

According to various embodiments, the portable electronic device may further comprise at least one of a film, a deposited layer, or a painted layer surrounding at least a portion of a surface of the second injection-molded member forming the exterior of the portable electronic device.

According to various embodiments, the coupling structure may include a shape in which the one of the first injection-molded member or the second injection-molded member penetrates into the other one of the first injection-molded member or the second injection-molded member.

According to various embodiments, a portable electronic device comprises a metal housing, an antenna module positioned in the metal housing, a first injection-molded member including an inorganic material and having a first dielectric constant, and a second injection-molded member having a second dielectric constant higher than the first dielectric constant, wherein the second injection-molded member may form, together with the metal housing, an exterior of the portable electronic device, and wherein the second injection-molded member be at least partially bonded with the first injection-molded member through a coupling structure with the first injection-molded member.

According to various embodiments, the portable electronic device may further comprise a first organic film disposed along an inner surface of the metal housing to bond with at least a portion of the first injection-molded member.

According to various embodiments, the portable electronic device may further comprise a second organic film disposed along the inner surface of the metal housing to bond with at least a portion of the second injection-molded member.

According to various embodiments, the first injection-molded member and the second injection-molded member may be positioned in a radiation direction of the antenna module.

According to various embodiments, a composition ratio for a raw material and an inorganic material included in the first injection-molded member may differ from that of the second injection-molded member.

According to various embodiments, types for a raw material and an inorganic material included in the first injection-molded member may differ from those included in the second injection-molded member.

According to various embodiments, in the coupling structure, the second injection-molded member may protrude into the first injection-molded member.

According to various embodiments, in the coupling structure, the first injection-molded member may protrude into the second injection-molded member.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A portable electronic device comprising:
a metal housing;
antenna circuitry positioned in the metal housing;
a first injection-molded member positioned in a radiation direction of the antenna circuitry and having a first dielectric constant;
a second injection-molded member at least partially in contact with the first injection-molded member, positioned in the radiation direction of the antenna circuitry, and having a second dielectric constant greater than the first dielectric constant;
a first organic film disposed along and contacting at least one first part of an inner surface of the metal housing to bond with at least a portion of the first injection-molded member; and
a second organic film disposed along and contacting at least one second part of the inner surface of the metal housing to bond with at least a portion of the second injection-molded member,
wherein the first injection-molded member, the second injection-molded member, and the antenna circuitry are disposed along a first direction at least partially parallel to the radiation direction,
wherein a length of the first injection-molded member in a second direction perpendicular to the first direction is greater than a length of the second injection-molded member in the second direction and a length of the antenna circuitry in the second direction, and
wherein the second injection-molded member is disposed to overlap with the antenna circuitry in its entirety in the radiation direction and forms, together with the metal housing, an exterior of the portable electronic device.

2. The portable electronic device of claim 1, wherein the metal housing is positioned on an upper end and a lower end of the second injection-molded member with respect to the radiation direction of the antenna circuitry.

3. The portable electronic device of claim 1, wherein a composition ratio of a raw material and an inorganic material included in the first injection-molded member differs from that of the second injection-molded member.

4. The portable electronic device of claim 1, wherein types of a raw material and an inorganic material included in the first injection-molded member differ from those included in the second injection-molded member.

5. The portable electronic device of claim 1, wherein the first dielectric constant differs from the second dielectric constant by a dielectric constant difference of 0.5 or more.

6. The portable electronic device of claim 1, further comprising:
a film surrounding at least a portion of a surface of the second injection-molded member forming the exterior of the portable electronic device.

7. The portable electronic device of claim 1,
wherein the first injection-molded member forms the first organic film in a region between the at least one first part of the inner surface of the metal housing and the portion of the first injection-molded member,
wherein the second injection-molded member forms the second organic film in a region between the at least one second part of the inner surface of the metal housing and the portion of the second injection-molded member, and
wherein the second organic film is formed after the first organic film is formed.

8. The portable electronic device of claim 1,
wherein a length measured in the second direction of a radiation area emitted in the radiation direction from the antenna circuitry is greater than a length measured in the first direction of the second injection-molded member,
wherein the second direction is a direction intersecting the radiation direction and the first direction, and
wherein, when the antenna circuitry is viewed from outside the portable electronic device in a direction through the second injection-molded member, the second injection-molded member overlaps the antenna circuitry in its entirety.

9. The portable electronic device of claim 1, wherein the second injection-molded member is coupled with the first injection-molded member through a coupling structure in which one of the first injection-molded member or the second injection-molded member is at least partially protruding into another one of the first injection-molded member or the second injection-molded member.

10. The portable electronic device of claim 9, wherein, in the coupling structure, the second injection-molded member protrudes into the first injection-molded member.

11. The portable electronic device of claim 9, wherein, in the coupling structure, the first injection-molded member protrudes into the second injection-molded member.

12. The portable electronic device of claim 9, wherein the coupling structure includes a shape in which the one of the first injection-molded member or the second injection-molded member penetrates into the other one of the first injection-molded member or the second injection-molded member.

13. The portable electronic device of claim 9, wherein the coupling structure includes a shape in which the one of the first injection-molded member or the second injection-molded member penetrates into the other one of the first injection-molded member or the second injection-molded member.

14. A portable electronic device comprising:
a metal housing;
antenna circuitry positioned in the metal housing;
a first injection-molded member including an inorganic material and having a first dielectric constant;
a second injection-molded member having a second dielectric constant greater than the first dielectric constant;
a first organic film disposed along and contacting at least one first part of an inner surface of the metal housing to bond with at least a portion of the first injection-molded member; and a second organic film disposed along and contacting at least one second part of the inner surface of the metal housing to bond with at least a portion of the second injection-molded member, wherein the first injection-molded member, the second injection-molded member, and the antenna circuitry are disposed along a first direction at least partially parallel to a radiation direction of the antenna circuitry, wherein a length of the first injection-molded member in a second direction perpendicular to the first direction is greater than a length of the second injection-molded member in the second direction and a length of the antenna circuitry in the second direction, and wherein the second injection-molded member is disposed to overlap with the antenna circuitry in its entirety in the radiation direction of the antenna circuitry and forms, together with the metal housing, an exterior of the portable electronic device.

15. The portable electronic device of claim 14, wherein the first injection-molded member and the second injection-molded member are positioned in the radiation direction of the antenna circuitry.

16. The portable electronic device of claim 14, wherein a composition ratio of a raw material and an inorganic material included in the first injection-molded member differs from that of the second injection-molded member.

17. The portable electronic device of claim 14, wherein types of a raw material and an inorganic material included in the first injection-molded member differ from those included in the second injection-molded member.

18. The portable electronic device of claim 14, wherein the first dielectric constant differs from the second dielectric constant by a dielectric constant difference of 0.5 or more.

19. The portable electronic device of claim 14,
wherein the second injection-molded member is at least partially bonded with the first injection-molded member through a coupling structure with the first injection-molded member, and
wherein, in the coupling structure, the second injection-molded member protrudes into the first injection-molded member.

20. The portable electronic device of claim 14,
wherein the second injection-molded member is at least partially bonded with the first injection-molded member through a coupling structure with the first injection-molded member, and
wherein, in the coupling structure, the first injection-molded member protrudes into the second injection-molded member.

* * * * *